United States Patent [19]

Debortoli et al.

[11] Patent Number: 4,894,024
[45] Date of Patent: Jan. 16, 1990

[54] TELECOMMUNICATIONS WALL OUTLETS

[75] Inventors: George Debortoli, Ottawa; Brian T. Osborne, Kanata, both of Canada

[73] Assignee: Northern Telecom Limited, Montreal, Canada

[21] Appl. No.: 275,885

[22] Filed: Nov. 25, 1988

[51] Int. Cl.[4] .......................................... H01R 13/74
[52] U.S. Cl. ...................................... 439/535; 439/76
[58] Field of Search ................ 439/76, 344, 535–539, 439/676

[56] References Cited

U.S. PATENT DOCUMENTS

| | | | |
|---|---|---|---|
| 4,392,701 | 7/1983 | Weidler | 439/638 |
| 4,595,799 | 6/1986 | Krob et al. | 439/76 |
| 4,641,900 | 2/1987 | Japngie | 439/76 |
| 4,725,249 | 2/1988 | Blackwood et al. | 439/535 |
| 4,756,695 | 7/1988 | Lane et al. | 439/76 |
| 4,767,338 | 8/1988 | Dennis et al. | 439/76 |

FOREIGN PATENT DOCUMENTS 2934667 3/1981 Fed. Rep. of Germany ...... 439/676

Primary Examiner—Gary F. Paumen
Attorney, Agent, or Firm—R. J. Austin

[57] ABSTRACT

A telecommunications wall outlet having a circuit assembly, i.e. a printed circuit or a resistor network within a housing. A modular jack and a connector are electrically connected together by the circuit assembly and are mounted upon it. Preferably, the housing wall and circuit assembly cooperate to hold the circuit assembly in position and the walls have provision for holding conductors in place as they are led from a wall into the outlet.

8 Claims, 4 Drawing Sheets

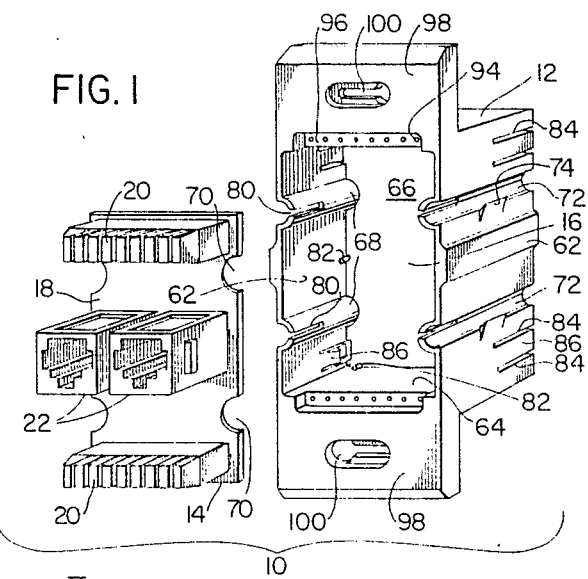
FIG. 1
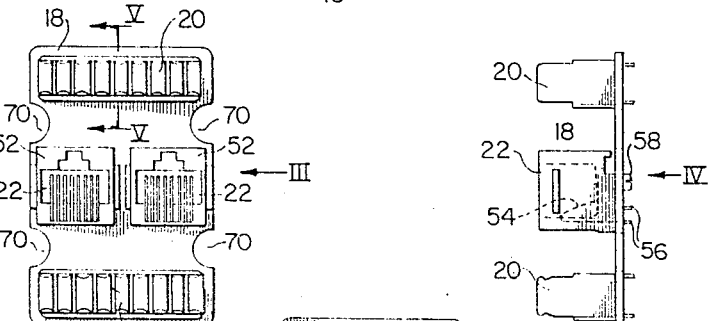
FIG. 2
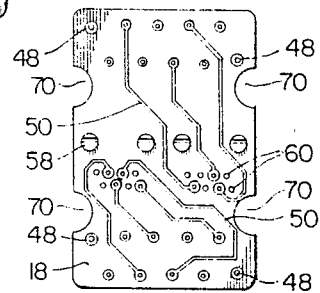
FIG. 3
FIG. 4

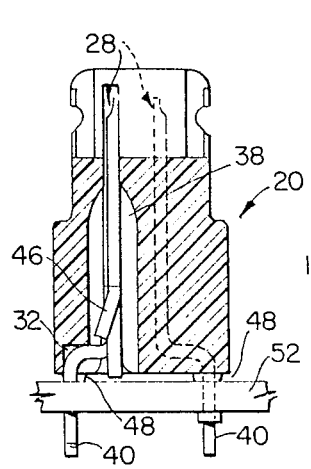
FIG. 9
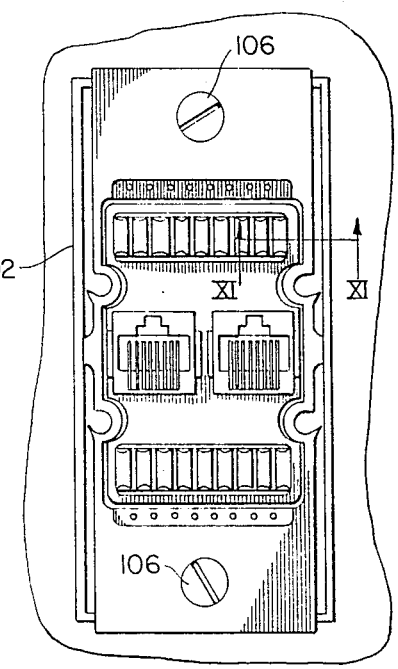
FIG. 10
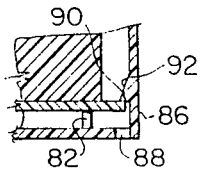
FIG. 11
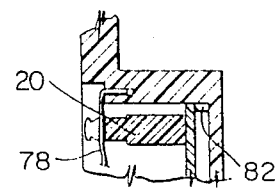
FIG. 12
FIG. 13

TELECOMMUNICATIONS WALL OUTLETS

BACKGROUND OF THE INVENTION

This invention relates to telecommunications wall outlets.

Telecommunications wall outlets are commonly known. These conventionally have a modular jack providing terminals for a customer's internal wiring for connection by a plug to telecommunication equipment which may be in the form of telephones or data processing terminals. Two modular jacks may be provided and these may be wired for use for different purposes, e.g. one for telephone use and the other for data processing use.

Recently, telecommunications outlets have been used in which a housing, suitably sized to fit into ordinary household electrical wall outlet boxes, carries a modular jack and another connector upon a support. With such outlets, the modular jacks need to be manually wired in a factory environment to the other connector. With the outlet then on site, the other connector then requires connecting to the customer's internal wiring as the outlet is being fitted into the wall outlet box. Because of the small size of the support to enable it to be fitted into a household electrical wall outlet box, there is a complication in that the wiring procedure within the factory is difficult to perform and, when on site, the presence of the factory wiring may be confusing to the installer.

The present invention seeks to provide a telecommunications wall outlet in which the above problems are minimized.

SUMMARY OF THE INVENTION

Accordingly, the present invention provides a telecommunications wall outlet comprising a housing for a circuit assembly, and a circuit assembly for mounting within a chamber in the housing: the housing comprising a base and a plurality of walls extending from the base to define the chamber of the housing, and an opening to the chamber remote from the base; and at least one region of a wall of the housing providing guide means projecting inwardly into the chamber and extending in a direction from the opening towards the base, for guiding the circuit assembly into a desired operational position within the chamber; and said region of the wall also defining a cable guide formed in an outer surface of the wall for receiving and guiding cable along the wall from the base towards the opening to the chamber; and the circuit assembly comprising a circuit member, which provides a support element rigidly carrying electrical pathways in intimate contact with the support element, a modular telecommunications jack and a connector; the circuit member having two sides, the jack and the connector both mounted upon the circuit member and both having electrical terminal members, electrical pathways on the support element interconnecting terminal members of the jack with terminal members of the connector; and the circuit member having an edge with a recessed part cooperable with the guide means of the housing for guiding the circuit assembly as it is moved through the opening into the desired operational position with one of the two sides of the circuit member facing the base of the housing.

The circuit member may be in the form of a printed circuit board or a resistor network which comprises a ceramic base with electrical pathways added by thick film techniques.

The invention provides the advantage that with the use of the circuit member which may be in the form of a printed circuit board or resistor network, the wall outlet is of compact form devoid of wiring extending from the modular jack to the connector. Thus, there is no wiring present when the outlet is installed which may confuse the installer as he adds his own wiring to connect the connector to the internal wiring of a customer's premises. Furthermore, the use of the circuit member enables the electrical pathways between the jack and the connector to be made by automatic means devoid of manual control so that the difficult wiring procedure which has previously been followed for wall outlets is completely avoided thereby simplifying the manufacturing process and the cost of the article. The use of a circuit member also avoids rejects caused by bad or incorrect manual wiring.

In addition, wall outlets according to the invention while being of substantially the same size provide different end functions. As examples of this, where a wall outlet has a single modular jack, the jack may be connected to the connector in such a manner by the electrical pathways, that the outlet is either designed for use with a telephone or is designed for use with a data processing terminal. In other examples, where two modular jacks form part of the wall outlet, the end use of these jacks is either designed for the use of both jacks with telephones, designed for the use of both jacks with a data processing terminals, or for the use of one jack with a telephone and the other with a terminal. These design differences are accommodated by the use of different design of circuit members, i.e. the design of electrical pathways is different from one design of circuit member to another. A design change in wall outlets may thus be easily controlled by changing the design of circuit member to be used in the wall outlets at a specific time, i.e. upon the total quantity of wall outlets of a first design having met requirements. Such a design change is easily made during continuous in-line production of wall outlets as the assembly procedure of a circuit member with a modular jack and the connector need not change even if the design of circuit member changes if it is understood that the positions of the jack and connector do not change upon the circuit member. Design changes for different end uses of conventional wall outlets would not be easily implemented as this would involve the retaining of assembly personnel to deal with different wiring procedures. Not only would this be time consuming, but would increase the percentage of wall outlet rejects because of confusion.

BRIEF DESCRIPTION OF THE DRAWINGS

Embodiments of the invention will now be described by way of example, with reference to the accompanying drawings, in which:

FIG. 1 is an exploded isometric view of a telecommunications wall outlet according to a first embodiment;

FIG. 2 is a front view of a circuit assembly forming part of the wall outlet of FIG. 1;

FIG. 3 is a side elevational view of the circuit assembly taken in the direction of arrow III in FIG. 2;

FIG. 4 is a rear view of the circuit assembly taken in the direction of arrow IV in FIG. 3;

FIG. 9 is a view similar to FIG. 5 showing the connector of FIG. 5 forming part of the circuit assembly;

FIG. 10 is a front view of the completed wall outlet installed in an electrical wall outlet box in a wall;

FIG. 11 is a cross-sectional view of part of the wall outlet taken along line XI—XI in FIG. 10;

FIG. 12 is an isometric view of part of the wall outlet assembly showing a method of leading insulated customer's internal wiring into the outlet;

FIG. 13 is a cross-sectional view taken along line XIII—XIII in FIG. 12;

DETAILED DESCRIPTION OF THE INVENTION

Figures 5, 6:
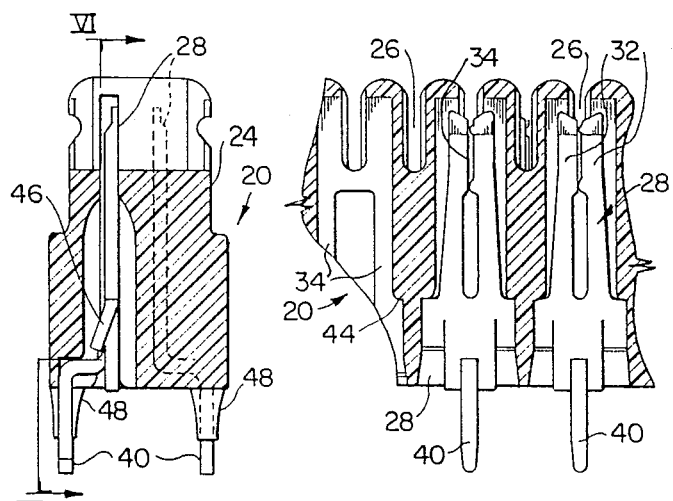
FIG. 5 is a cross-sectional view taken along line V—V in FIG. 2 of a connector forming part of the circuit assembly and shown a larger scale.
FIG. 6 is a cross-sectional view taken along line VI—VI in FIG. 5 of the connector.

As shown in FIG. 1, in a first embodiment, a telecommunications wall outlet 10 comprises a housing 12 and a circuit assembly 14 for mounting within a chamber 16 of the housing.

As shown by FIGS. 1, 2, 3 and 4, the circuit assembly comprises a planar circuit member provided by a planar support element which rigidly carries electrical pathways in intimate contact with the support element. Generally such a circuit member may comprise a resistor network which has a ceramic base and electrical pathways formed by thick film techniques, but, in this embodiment the circuit member comprises a printed circuit board 18 made in conventional manner. The printed circuit board 18 carries two connectors 20, disposed at opposite ends of the board, and two modular telephone jacks 22 located between the two connectors 20, the two modular jacks being aligned across the circuit board.

Figures 7, 8:
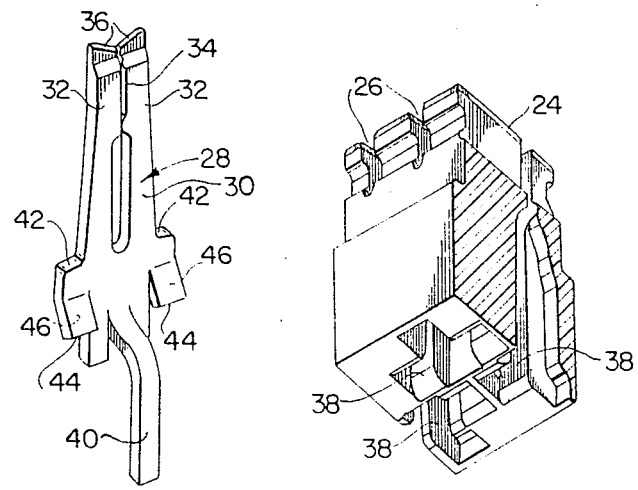
FIG. 7 is an isometric view of a terminal member of the connector of FIGS. 5 and 6 and shown to a larger scale.
FIG. 8 is an isometric view from the underside of a body connector of the of FIGS. 5 and 6.

The connectors 20 are of the construction described in U.S. patent application No. 275,811 in the name of R. Paradis. With reference to FIGS. 5 to 9, the construction of each connector 20 is briefly as follows. Each connector has a single molded planar dielectric body 24 which has along one of its sides a plurality of molded slots 26. A plurality of terminal members 28 extend through the body, each terminal member having a longitudinally extending main portion 30 which is bifurcated for substantially the whole of its length to provide two arms 32 located substantially side-by-side in the same plane. The arms 32 extend into a slot 26 with the arms providing an insulation displacement terminal by defining a slot 34 between them for acceptance of a conductor wire, the slot 34 being in alignment with the corresponding slot 26. As shown in FIGS. 6 and 7, free ends of the two arms are inclined at positions 36 to provide cutting edges for cutting insulation around conductor wires to enable the wires to be forced between the arms with insulation locally removed to cause the wires to make electrical contact with the arms. Such insulation displacement terminals are well known in the art and will be described no further.

To minimize the size of the connector and thus of the circuit board 18 to enable the outlet 10 to be disposed within a conventional domestic electrical wall outlet, the insulation displacement terminals are arranged in two staggered rows in the body 24. For this purpose, the body has cavities 38 for accommodating the terminal members, the cavities themselves overlapping in two rows as shown particularly by FIG. 8.

Each terminal member 28 also comprises a terminal pin 40 which is remote from the arms 32. Each terminal pin 40 lies in a plane displaced laterally from the plane of the arms 32 (see particularly FIGS. 5 and 7) so that when the terminal members are positioned within the cavities 38, the pins lie in two staggered rows with the terminal pins of each row displaced laterally of the plane of the body away from the other row (FIGS. 5 and 9).

Each of the terminal members 28 is inserted into the respective cavity 38 through an opening to the cavity remote from the slots 26. The terminal members are moved into the cavities 38 until shoulders 42 at each side of each terminal member engage with a seating abutment 44 formed within the cavity. To prevent removal of each of the terminal members, each member is also provided with two projections 46 which are inclined relative to the arms 32 so that the projections 46 become embedded into the plastics material of the body 24 as the terminal member is being inserted into the body. As can be seen from FIGS. 5 and 9, the projections 46 embed themselves into the material of the body so as to resist removal of the terminal members.

For mounting the connectors 20 into the circuit board 18, the body 24 of each connector is formed with two molded mounting pins 48 which extend outwardly in the same direction as the terminal pins 40. These pins 48 are received within suitably positioned holes in the circuit board 18 (FIGS. 4, 5 and 9) for assisting in locating the connectors 20 correctly in position with the pins 40 extending through pin receiving holes in the circuit board. The pins 40 are soldered in position within the holes and are thus electrically connected with electrical pathways of the circuit board, these pathways 50 being on the rear surface of the circuit board 18 as shown in FIG. 4.

Each of the modular jacks 22 is of conventional construction in that it has a molded dielectric body 52 formed with a suitable opening to accept a plug for connecting it to customer end user equipment such as a telephone or a data processing terminal. Each modular jack 22 also has a plurality of leaf spring terminals 54 (see FIG. 3) with ends of the leaf springs extending into a chamber of the modular jack for electrical contact with terminals of the plug. The leaf spring terminals 54 extend through the body 52 to terminate in terminal pins 56 (FIG. 3) on a rear side of the body. The body is also formed with a molded pin 58. The modular jacks are assembled onto the circuit board 18 with the pins 58 locating the jacks correctly in position by location through suitably positioned holes in the circuit board. The terminal pins 56 extend into and are soldered within holes 60 in the circuit board (FIG. 4). Thus in the final circuit assembly, the terminal pins 40 of the connectors 20 are electrically connected by the printed circuit pathways 50 with the terminal pins 56 of the modular jacks.

As may be seen from the above description, the circuit assembly 14 may be completely manufactured nonmanually. The connectors, modular jacks and the printed circuit board are made by established automatic processes. Automatic operations also mount the connectors and the modular jacks onto the printed circuit board and solder the pins 40 and 56 into position. Thus, the need for manually applied wiring between terminal jacks and connectors is completely avoided together with the problems associated with incorrect wiring. Also, because of the total lack of wiring in the complete circuit assembly, the assembly appears to be of simple construction and is easier for an installer to connect the wall outlet to a customer's internal wiring on site.

As shown in FIG. 1, the housing 12 has two long parallel walls 62 and two short parallel walls 64 forming a rectangular opening to the chamber 16. A base 66 to the chamber extends between the walls in the position opposite the opening.

The housing 12 is provided with guide means for guiding the circuit assembly 14 into a desired operational position within the housing. This guide means comprises at least one region of a wall which projects into the chamber for cooperating with an inwardly extending region of the circuit board 18 as it is moved into the chamber 16 through the opening. In this embodiment, two projecting regions of each wall 62 are provided, each projecting region being in the form of a curved part 68 of its respective wall 62. Each curved part of the wall 62 extends longitudinally from the opening to the chamber as far as the base 66 and is of part cylindrical shape. The curved part of each wall lies opposite to a curved part of the other wall 62 and as can be seen from FIGS. 1, 2 and 4, the circuit board 18 is formed with corresponding convex surface parts 70 in opposite side edges for guiding cooperation with the curved parts 68.

The curved parts 68 of the wall 62 also provide another function in that they provide cable retainers on the housing for supply of telecommunications cable to the connectors 20 when the circuit board is carried within the housing 12. As is shown particularly by FIGS. 1 and 12, each cable retainer is provided by a concave surface 72 formed by the curved part 68 on the outside of the wall 62. An outer projection 74 of the wall extends partially across and is spaced from each concave surface 72 to act as a cable retainer for cable seated against the concave surface. As shown in FIG. 12, a cable 76 may be inserted between a projection 74 and against the concave surface 72 so as to hold it firmly in position so that the conductors 78 of the cable may be connected to the terminals of a connector 20 as will be described.

Each of the curved parts 68 of the wall 62 is also formed with a slot 80 which extends from the opening to the chamber towards the base for passage therethrough of the conductors 78 of the cable as shown by FIGS. 1 and 12. Hence, the curved parts 68 of the walls 72 provide a multifunction in that they serve to guide the circuit assembly 12 into position, provide seating surfaces 72 for a cable while a holding projection 74 holds a cable in position, and also provide access for conductors of the cable from outside of the housing into the chamber 16.

For locating the circuit assembly 12 in its desired operational position, the housing is provided with a stop means for terminating the movement of the circuit assembly along the guides provided by the curved parts 68. The stop means comprises four short projections 82 extending upwardly from the base 66 and outwardly from the walls 64, two projections from each wall. FIG. 1 shows two of the projections for one wall 64 and a projection 82 is also shown in FIGS. 11 and 13.

The housing is also provided with latch means for retaining the circuit assembly in its desired operational position with the rear face of the circuit board 18 engaging the ends of the projections 82 as shown in FIGS. 11 and 13. The latch means is provided by the walls 62. As can be seen from FIG. 1, each of the walls 62 is provided towards each of its ends with two parallel slots 84 extending upwardly from the base for a certain distance to define between the slots a resilient prong 86 which is also separated from the base by a gap 88 as shown in FIG. 11. Each prong 86 is provided with an inward latch projection 90 having an abutment surface facing towards the base 66.

As may be seen, when the circuit assembly 14 is located at the opening to the chamber 16 and with the curved surface parts 70 aligned with the curved parts 68 of the walls, the circuit assembly may be guided into the chamber 16 along the curved parts 68. As the edges of the circuit board 18 engage inclined surfaces 92 of the projections 90, continued inward movement of the circuit assembly towards the base 66 forces the prongs 86 outwardly. Upon the circuit board engaging the projections 82, the circuit board has passed just beyond the ends of the latches 90 thereby allowing the prongs 86 to return resiliently to their normal positions in alignment with the remainder of the walls 62. Hence, the latches 90 hold the circuit board against the stops 82. To enable the circuit board and thus the circuit assembly 12 to be removed from the housing, it is simply necessary to insert a suitable thin instrument into the gaps 88 to flex the prongs 86 outwardly and away from the circuit board so that the latching effect is removed.

The housing 14 is also provided with conductor receiving holes for accepting the ends of conductors extending through the insulation displacement terminals of each of the connectors 20. These conductor receiving holes 94 (FIGS. 1 and 12) extend inwardly towards the base in each of the walls 64 from a recessed surface 96 of each wall 64, the holes being positioned for alignment with corresponding slots 26 of the connectors 20.

As may be seen also from FIG. 1, the housing 14 is formed at opposite ends with two outwardly extending flanges 98 formed with suitable screw receiving slots 100 for location of mounting screws to assemble the housing 14 to an electrical wall outlet box in the conventional manner for mounting electrical sockets into outlet boxes in a domestic premises.

It is a relatively simple matter to assemble together the wall outlet, locate it within an electrical wall outlet box, and to connect incoming telecommunication conductors to the appropriate terminals of the connectors 20.

The assembly of the outlet may be first completed by disposing the circuit assembly 14 within the housing 12 so that their relative positions are as shown in FIG. 10. With the outlet 10 held outside of but closely to the electrical wall outlet box 102, the ends of the internal telecommunications cables 76 which project from the wall through the box 102 are seated and held against the concave surfaces 72 by the projections 74 as described above and shown in FIG. 12. The conductors 78 of these cables are then passed through the slots 80 and are located through slots 26 of connectors 20 to be positioned between the arms 32 of the insulation displacement terminals to make electrical connections there-with. The insulated ends of the conductors 78 which project through the terminals are then bent at right angles and are pushed into the conductor receiving holes 94 for the purpose of protecting the ends of the conductors from short circuiting. As may be seen, when the conductors 78 are fed through the slots 80 and located in the insulation displacement terminals, there are no other wires visible within the housing 14 which may cause confusion to the installer as the printed circuit board pathways take care of the necessary electrical connections and these are in any case on the rear side of the circuit board 18. Hence it is a relatively simple matter for the installer to make the necessary electrical connections in this embodiment.

Figures 14, 15:
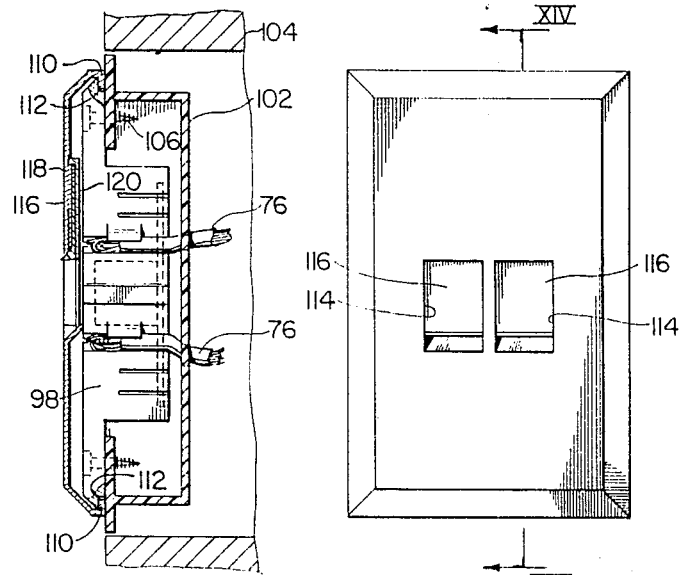
FIG. 14 is a front view showing a cover plate over the installed wall outlet.
FIG. 15 is a cross-sectional view through the installed wall outlet cover plate and electrical wall outlet box taken along line XV—XV in FIG. 14.

After assembly of the wires to the outlet, the outlet is then secured to the wall outlet box 102 within the wall 104 (FIG. 14) by captive screws 106 accepted through the slots 100. A suitable cover 108 is then located over the outlet 10. This cover 108 may be resiliently pressed into position. For this purpose, the cover may have shallow inward projections 110 for acceptance within corresponding recesses 112 on the rear free edge of each of the flanges 98 as shown in FIG. 14. The cover 108 has two openings 114 (FIGS. 14 and 15) which are aligned with the openings to the two jacks for acceptance of plugs of telecommunications equipment. These openings 114 may be normally closed by a spring loaded slidable door 116 received between a front wall 118 of the cover and a localized back wall 120 as shown in FIG. 14.

Figure 16:
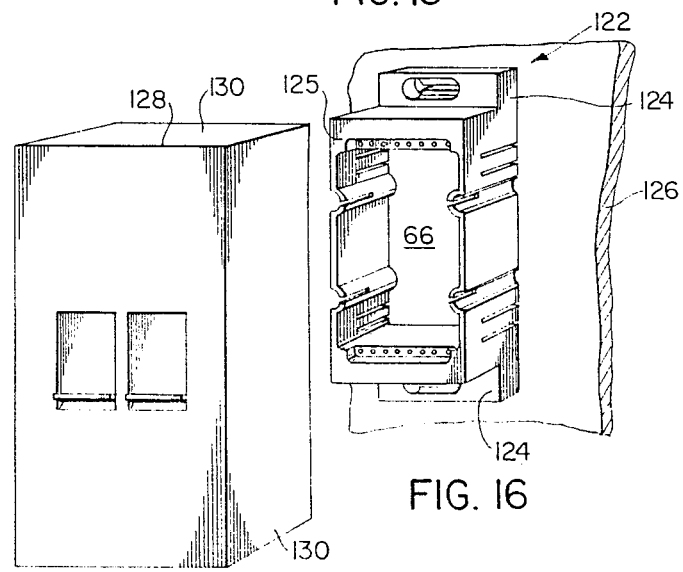
FIG. 16 is an exploded isometric view showing parts of a wall outlet according to a second embodiment with a housing of the outlet installed upon a wall.

In a second embodiment of the invention as shown in FIG. 16, the structure of an outlet 122 is as described in the first embodiment with the exception that flanges 124 are provided as extensions to the base 66 of the housing 125 instead of having flanges 98 disposed remote from the base as in the first embodiment. The circuit assembly 14 is omitted for clarity and simplicity. As shown in FIG. 16, the outlet of the second embodiment is for location upon the exterior surface of a wall 126 where wiring within the wall and a suitable electrical outlet are not provided. The housing 125 may be shrouded by a suitably shaped box cover 128 having walls 130 which extend around the sides of the housing 125 and are resiliently located in position upon the flanges 124 in a manner similar to the location of the cover 108 in the first embodiment.

What is claimed is:

1. A telecommunications wall outlet comprising a housing for a circuit assembly, and a circuit assembly for mounting within a chamber in the housing:
   the housing comprising:
   a base and a plurality of walls extending from the base to define the chamber of the housing, and an opening to the chamber remote from the base; and
   at least one region of a said wall of the housing providing guide means projecting inwardly into the chamber and extending in a direction from the opening towards the base, for guiding the circuit assembly into a desired operational position within the chamber; and
   said region of the wall also defining a cable guide formed in an outer surface of the wall for receiving and guiding a cable therein along the wall from the base towards the opening to the chamber; and
   the circuit assembly comprising
   a circuit member which provides a support element rigidly carrying electrical pathways in intimate contact with the support element, a modular telecommunications jack and a connector;
   the circuit member having two sides, the jack and the connector both being mounted upon the circuit member and both having electrical terminal members, said electrical pathways on the support element interconnecting terminal members of the jack with terminal members of the connector; and
   the circuit member having an edge with a recessed part cooperable with the guide means of the housing for guiding the circuit assembly as it is moved through the opening into the desired operational position with one of the two sides of the circuit member facing the base of the housing.

2. A telecommunications wall outlet according to claim 1 wherein said region of the wall is curved with the guide means provided by a convex surface on the chamber side of the wall and the outer surface of the wall is concave to provide the cable guide with the concave outer surface aligned through the wall with the convex surface, and the recessed part of the circuit member is of concave shape for cooperation with and movement along the convex surface.

3. A telecommunications wall outlet comprising a housing for a circuit assembly, and a circuit assembly for mounting within a chamber in the housing:
   the housing comprising
   a base and a plurality of walls extending from the base to define the chamber of the housing, and an opening to the chamber remote from the base; and
   at least one region of a said wall of the housing being curved to project inwardly into the chamber to provide a convex inner guide surface extending in a direction from the opening towards the base, for guiding the circuit assembly into a desired operational position within the chamber; and
   said region of the wall also having a concave outer surface, the concave outer surface providing a cable guide for receiving and guiding a cable therein along the wall from the base towards the opening to the chamber;
   the housing also being provided with a cable retainer, said cable retainer provided by an outer projection of the wall, said projection extending partially across and spaced away from the concave surface for holding cable seated against the concave surface; and
   the circuit assembly comprising
   a circuit member which provides a support element rigidly carrying electrical pathways in intimate contact with the support element, a modular telecommunications jack and a connector;
   the circuit member having two sides and the jack and the connector both being mounted upon the circuit member and both having electrical terminal member, said electrical pathways on the support element interconnecting terminal members of the jack with terminal members of the connector; and
   the circuit member having an edge with a recessed part having a concave shape for cooperation with and movement along the convex guide surface of said region of the wall for guiding the circuit assembly as it is moved through the opening into the desired operational position with one of the two sides of the circuit member facing the base of the housing.

4. A wall outlet according to claim 3 wherein the region of the wall is formed with a slot extending from the opening to the chamber towards the base for passage therethrough of conductors of a cable to be seated against the concave surface.

5. A wall outlet according to claim 3 wherein the modular jack and the connector are mounted upon the same side of the circuit member.

6. A wall outlet according to claim 3 wherein the housing is formed with means for electrical isolation of the free ends of conductors extending from the terminal members of the connector, the means for isolation comprising a plurality of conductor receiving bores in at least one wall of the housing, each bore being electrically isolated from the other bores and aligned with a corresponding terminal member of the connector.

7. A telecommunications wall outlet comprising a housing for a circuit assembly, and a circuit assembly for mounting within a chamber in the housing;

the housing comprising a base and a plurality of walls extending from the base to define the chamber of the housing, and an opening to the chamber remote from the base; and at least one region of said wall of the housing providing guide means projecting inwardly into the chamber and extending in a direction from the opening towards the base, for guiding the circuit assembly into a desired operational position within the chamber; and the circuit assembly comprising a circuit member which provides a support element rigidly carrying electrical pathways in intimate contact with the support element, a modular telecommunications jack and a connector;

the circuit member having two sides, and the jack and the connector both being mounted upon the circuit member and both having electrical terminal members, said electrical pathways on the support element interconnecting terminal members of the jack with terminals members of the connector; and the circuit member having an edge with a recessed part cooperable with the guide means of the housing for guiding the circuit assembly as it is moved through the opening and towards the base into a desired operational position with one of the two sides of the circuit member facing the base of the housing;

a said wall of the housing defining at least one latch means cooperable with the support element when the circuit assembly is in the desired operational position to prevent movement of the circuit assembly out of said operational position, wherein the latch means comprises a resilient cantilever prong formed as part of and lying in the plane of the associated wall and within the confines of the wall, the resilient cantilever prong extending towards the base of the housing to terminate in a free end of the prong, the prong having an inward latch projection, the latch projection having an inclined surface face extending into the chamber and facing towards the chamber opening, the projection also having an abutment surface facing the base for engagement with the circuit member to hold the circuit assembly in its desired operational position; and the prong being resiliently movable outwards from the plane of the wall upon engagement of the inclined surface by the circuit assembly during movement of the circuit assembly towards the operational position and the prong then returning resiliently to the plane of the wall so that the latch projection holds the circuit assembly in its operational position.

8. A telecommunications wall outlet comprising a housing for a circuit assembly, and a circuit assembly for mounting within a chamber in the housing;

the housing comprising a base and a plurality of walls extending from the base to define the chamber of the housing, and an opening to the chamber remote from the base, and two walls opposing each other across the chamber, and at least one region of each wall projecting inwardly into the chamber to provide a convex inner guide surface for the circuit assembly extending in a direction from the opening towards the base;

each said at least one region defining a cable guide formed in an outer surface of the respective wall for receiving said guiding a cable therein along the wall from the base towards the opening to the chamber; and the circuit assembly comprising a circuit member which provides a support element rigidly carrying electrical pathways in intimate contact with the support element, a modular telecommunications jack and a connector;

the circuit member having two sides, the jack and the connector both being mounted upon the circuit member and both having electrical terminal members, said electrical pathways on the support element interconnecting terminal members of the jack with terminal members of the connector; and the circuit member having inwardly extending recesses of concave shape for cooperation with and movement along the convex guide surfaces as the circuit assembly is moved into the chamber through the opening with one of the two sides of the circuit member facing the base of the housing.

* * * * *